(12) United States Patent
Czaplewski et al.

(10) Patent No.: US 10,226,896 B2
(45) Date of Patent: *Mar. 12, 2019

(54) DESIGNING OBJECTS HAVING THERMAL INTERFACE PROPERTIES FOR THERMAL CONDUCTIVITY

(71) Applicant: International Business Machines Corporation, Armonk, NY (US)

(72) Inventors: Sarah K. Czaplewski, Rochester, MN (US); Joseph Kuczynski, North Port, FL (US); Jason T. Wertz, Pleasant Valley, NY (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/654,862

(22) Filed: Jul. 20, 2017

(65) Prior Publication Data

US 2017/0315539 A1 Nov. 2, 2017

Related U.S. Application Data

(63) Continuation of application No. 14/944,791, filed on Nov. 18, 2015, now Pat. No. 9,757,903.

(51) Int. Cl.
*G05B 19/4099* (2006.01)
*B33Y 50/02* (2015.01)
(Continued)

(52) U.S. Cl.
CPC .......... *B29C 64/386* (2017.08); *B29C 64/393* (2017.08); *G05B 19/4099* (2013.01); *G06T 7/50* (2017.01); *H01L 23/42* (2013.01); *B33Y 50/02* (2014.12); *B33Y 80/00* (2014.12); *G05B 2219/35134* (2013.01); *G05B 2219/49007* (2013.01); *H01L 23/34* (2013.01); *Y02P 90/265* (2015.11)

(58) Field of Classification Search
CPC ..... B29C 64/386; G06T 7/50; G05B 19/4099; G05B 2219/35134; G05B 2219/49007; B33Y 50/02
See application file for complete search history.

(56) References Cited

U.S. PATENT DOCUMENTS

| 7,369,410 | B2 | 5/2008 | Chen et al. | |
| 9,757,903 | B2 * | 9/2017 | Czaplewski | ......... B29C 64/393 |
| 2013/0337273 | A1 | 12/2013 | Boday et al. | |

OTHER PUBLICATIONS

Jacobson et al., Technologies for High Quality Printing of Stencil/Screen Printable Thermal Interface Materials, IP.com Prior Art Database Technical Disclosure, May 29, 2009.
(Continued)

*Primary Examiner* — John C Hong
(74) *Attorney, Agent, or Firm* — Lieberman & Brandsdorfer, LLC

(57) ABSTRACT

Designing an object having thermal interface properties to form a thermal interface between electronic components is provided. Surface topography data associated with an exposed surface of a body is derived. A thermal interface object having thermal interface properties is created based on the surface topography data, which includes translating the first surface topography data to a first surface of the thermal interface object.

20 Claims, 3 Drawing Sheets

(51) Int. Cl.
*B29C 64/386* (2017.01)
*B29C 64/393* (2017.01)
*G06T 7/50* (2017.01)
*H01L 23/42* (2006.01)
*H01L 23/34* (2006.01)
*B33Y 80/00* (2015.01)

(56) References Cited

OTHER PUBLICATIONS

List of IBM Patents or Applications Treated as Related, Jul. 2017.

* cited by examiner

DESIGNING OBJECTS HAVING THERMAL INTERFACE PROPERTIES FOR THERMAL CONDUCTIVITY

CROSS REFERENCE TO RELATED APPLICATION(S)

This application is a continuation patent application claiming the benefit of the filing date of U.S. patent application Ser. No. 14/944,791, filed on Nov. 18, 2015, titled "Designing Objects Having Thermal Interface Properties for Thermal Conductivity", now pending, which is hereby incorporated by reference.

BACKGROUND

The embodiments described herein relate to a thermal interface between a heat source and a heat exchanger. More particularly, the embodiments described herein relate to designing a thermal interface to reduce thermal resistance and effectively dissipate heat from the heat source.

A thermal interface material (TIM) is a material employed to reduce thermal resistance at the interface of the heat source and the heat exchanger. The path of heat removal from an electronic package, such as a central processing unit (CPU), involves conduction across the interface of the CPU (CPU case surface, through a TIM, into a heat exchanger, such as a heat sink, and then convection to the environment. Thermal resistance is a measure of how well heat is transferred across the interface of two mating rigid surfaces, such as the CPU and the base of a heat sink. The lowest possible interface resistance is reached when the heat sink temperature approaches that of the CPU.

The CPU and heat sink surfaces being joined contain a combination of surface roughness and surface non-flatness. On a macroscopic level, this roughness is non-planar in the form of a concave, convex, or wavy surface, or a combination thereof across the surface. This roughness results in the interface being separated by air filled gaps without the presence of TIM. Contact resistance may be reduced by increasing the area of contact spots and using a TIM of high thermal conductivity that can conform to the imperfect surface features of the mating surfaces.

SUMMARY

The embodiments described herein relate to a method, a system, and an article for providing a thermal interface between electronic components.

According to one aspect, a method is provided for forming a thermal interface between bodies. Surface topography data associated with an exposed surface of a body is derived. A thermal interface object having thermal interface properties is created based on the surface topography data. The creation of the object includes translating the surface topography data to a surface of the thermal interface object.

According to another aspect, a system is provided to form a thermal interface between electronic components. The system includes a processor in communication with memory. The processor derives surface topography data associated with an exposed surface of a body. A thermal interface object having thermal interface properties is created based on the surface topography data. Creation of the object includes translating the surface topography data to a surface of the thermal interface object.

According to yet another aspect, a computer program product is provided to form a thermal interface between electronic components. The computer program product includes a computer-readable storage device having computer-readable program code embodied therewith. The program code is executable by a processor to derive surface topography data associated with an exposed surface of a body. An object having thermal interface properties is created based on the surface topography data, which includes program code to translate the surface topography data of the exposed surface of the body to a first surface of the thermal interface object.

Other features and advantages of the embodiments will become apparent from the following detailed description of the presently preferred embodiments, taken in conjunction with the accompanying drawings.

BRIEF DESCRIPTION OF THE SEVERAL VIEWS OF THE DRAWINGS

The drawings referenced herein form a part of the specification. Features shown in the drawings are meant to be illustrative of only some embodiments, and not of all embodiments unless otherwise explicitly indicated. Implications to the contrary are otherwise not to be made.

DETAILED DESCRIPTION

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of modules, etc., to provide a thorough understanding of embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

In the following description of the embodiments, reference is made to the accompanying drawings that form a part hereof, and which shows by way of illustration the specific embodiment in which the embodiments may be practiced. It is to be understood that other embodiments may be utilized because structural changes may be made without departing from the scope of the present embodiments.

Figure 1:
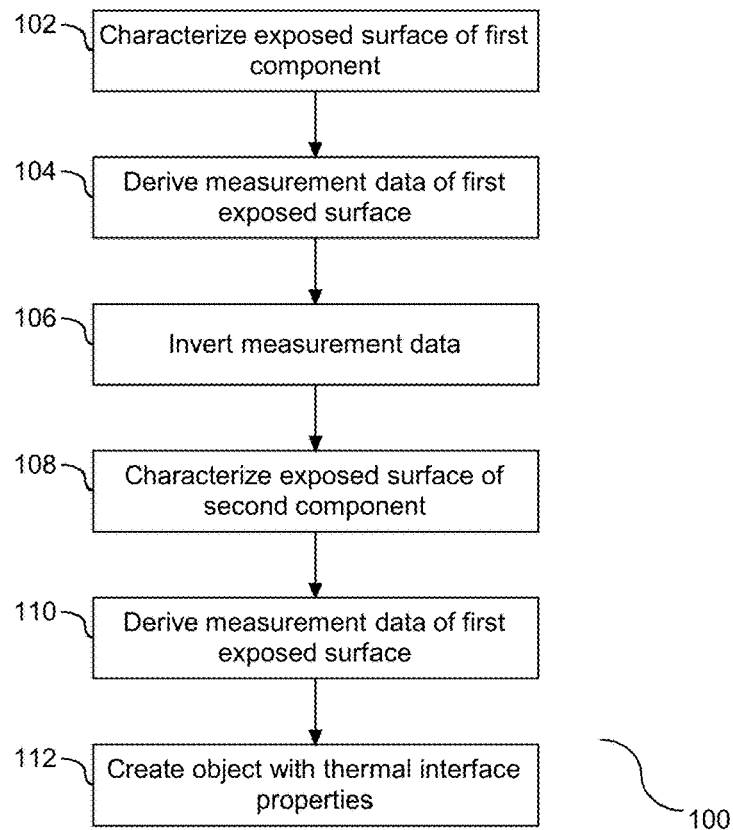
FIG. 1 is a flowchart depicting a process for designing and forming an object having thermal interface properties.

FIG. 1 is a flowchart (100) depicting a process for designing and forming an object having thermal interface properties to provide a thermal interface between components. The thermal interface places two components in thermal communication. For descriptive purposes, the first component is referred to herein as a heat generating component, such as but not limited to a semiconductor, CPU, or alternative heat producing component. Similarly, for descriptive purposes, the second component is referred to herein as a heat sink employed to absorb heat from the first component. Accordingly, it is to be understood and appreciated that the embodiments described herein with respect to the first and second electronic components should not be limiting.

An exposed surface of the first component is characterized by an electrical scan (102). In one embodiment, the characterization at step (102) utilizes laser technology for precise characterization. However, other known methods or technology for electrically scanning the first exposed surface may be employed, and as such, the use of laser technology should not be considered limiting. Accordingly, the first part of the TIM object formation pertains to scanning or otherwise deriving topological features of the first component.

Measurement data associated with the first exposed surface is derived based on the electronic scanning (104). The measurement data derived at step (104) may include, but is not limited to, surface topology data associated with the one or more scanned surfaces. In one embodiment, the derived measurement data is inverted (106) so that the scan data is reversed which may then be employed to create an inverted replica of the surface topology and filling any gaps within the surface topology. As indicated above, there are two exposed surfaces, one being the semiconductor and one being the heat sink. The process shown in steps (102)-(106) pertains to the derivation of the exposed surface of the first component.

In one embodiment, the exposed surface of a second component is characterized by an electrical scan (108), using similar if not the same technology employed with the scan at step (102). Measurement data associated with the second exposed surface is derived based on the scan of the second exposed surface (110). The measurement data derived at step (110) may include, but is not limited to, surface topology data associated with the second scanned surface.

After the topology of both of the exposed surfaces has been measured, an object having thermal interface properties based on the derived measurement data is created (112). In one embodiment, creating the object at step (112) includes programming the inverted topology data into a computer implemented or controlled machine such as a three dimensional printer. The programming may control a composition of the object material based on relative surface position along the first and second exposed surfaces of the first and second components, respectively. For example, the composition may be controlled to fill air gaps that may form during mating of the surfaces due to irregularities in the respective topologies. Three dimensional printers are known in the art, and a detailed description of how they operate will not be further provided herein.

The object created at step (112) may be referred to as a thermal interface material (TIM) object. In one embodiment, the TIM object is indium-based. However, other materials having high thermal conductivity may be used in accordance with the embodiments described herein.

Figure 2:
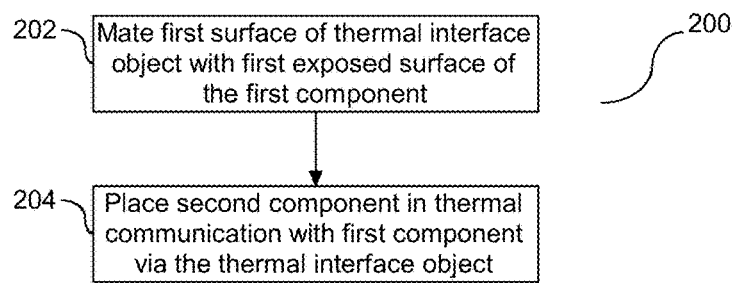
FIG. 2 is a flow chart illustrating the process of employing the three dimensional thermal interface object created in FIG. 1.

Following the creation of the TIM object in FIG. 1, the TIM object is mated to the exposed surfaces of the components to form the thermal interface. Referring to FIG. 2, a flow chart (200) is provided illustrating the process of forming a thermal interface between components by employing the TIM object of FIG. 1. There are two exposed surfaces, including a first exposed surface associated with the first component, e.g. a semi-conductor surface and a second exposed surface associated with the second component, e.g. a heat sink surface. The TIM object has two opposing surfaces, with a first of the TIM object surfaces being designed based on an inverted topology of the first exposed surfaces, and a second of the TIM object surfaces being designed based on an inverted topology of the second exposed surface. The first surface of the TIM object is mated with the first exposed surface of the first component (202). In one embodiment, the mating at step (202) includes applying the TIM object directly onto the first exposed surface. Since the object was printed based on topology data associated with the exposed surfaces of first and second components, the first surface of the TIM object and the first exposed surface are substantially aligned during the mating at step (202). The second electronic component is placed in thermal communication with the first component (204) via the TIM object. In one embodiment, the placement at step (204) includes placing the second exposed surface of the second component into contact with the remaining second surface of the TIM object.

One advantage of manufacturing objects with respect to the process of FIG. 1 and then attaching the created object as such in the process of FIG. 2 is that the object is designed to substantially match the topography of the exposed mating surfaces of the scanned first and second components. This results in more intimate contact between the components, thereby minimizing the existence of air gaps to optimize thermal conductivity and heat removal, e.g. reduce thermal resistance. Furthermore, this process provides the ability to pattern a TIM across the surface of an electronic component without stenciling or template creation for topological characteristics associated with each exposed surface.

Figure 3:
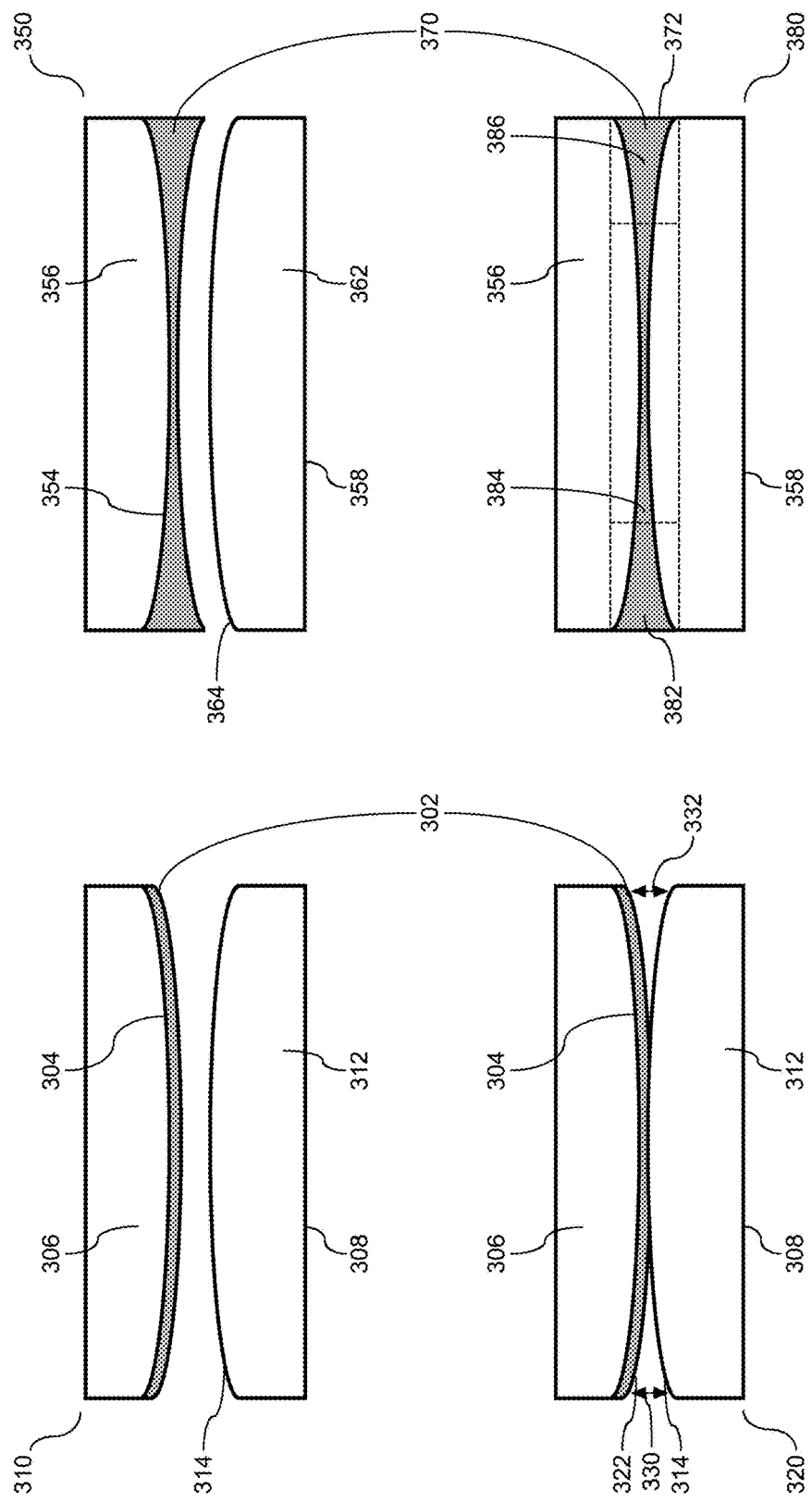
FIG. 3 is a block diagram illustrating an example of a comparison between the formation of a thermal interface between an electronic component and a heat sink using a conventionally created thermal interface object, and the formation of the thermal interface object between the electronic component and the heat sink as shown and described in the processes of FIGS. 1 and 2.

With reference to FIG. 3, a block diagram (300) is provided illustrating an exemplary comparison between the formation of a thermal interface between the first component and the second component using a conventionally created thermal interface material (TIM), and the formation of the thermal interface object between the first component and the second component as shown and described in the processes of FIGS. 1 and 2 (e.g., by use of a 3D printer). As discussed above with reference to FIG. 1, the first electronic component may be a heat generating component (e.g., a semiconductor) or a heat dissipating component (e.g., a heat sink), with the second electronic component being the other one.

The conventional use of a thermal interface material to mate between the exposed surfaces of the first and second components is shown and described at (310). Namely, at (310) the TIM object (302) is shown mated to an exposed surface (304) of the first component, e.g. the heat sink (306). The second component (308), e.g. semiconductor, is shown adjacently positioned to the first component (306). The second component (308) includes a body (312) with an exposed surface (314) adapted to receive the TIM object (302). Accordingly, at (310), the first and second components (306) and (308), respectively, and the TIM object (302) are shown prior to mating of the components.

At (320), the second component (308) is shown placed in communication with the first component (306) with an exposed surface (322) of the TIM (302) brought into contact with the exposed surface (314) of the second component (308). The formation of the thermal interface using the conventionally created TIM may result in the presence of one or more air gaps (330) and (332) between the first and second components. As previously discussed, the presence of air gaps increases thermal resistance.

The aspect of employing the customized TIM objects shown and described in the flow charts of FIGS. 1 and 2 is shown employed with the components at (350). Namely, at (350) the TIM object (370) is shown mated to an exposed surface (354) of the first component, e.g. the heat sink (356). The second component (358), e.g. semiconductor, is shown adjacently positioned to the first component (356). The second component (358) includes a body (362) with an exposed surface (364) adapted to receive the TIM object (370). Accordingly, at (350), the first and second components (356) and (358), respectively, and the TIM object (370) are shown prior to mating of the components.

At (380), the second component (358) is shown placed in communication with the first component (356) with an exposed surface (372) of the TIM object (370) brought into contact with the second component (358). The TIM object (370) includes three distinct areas, including a first area (382), a second area (384), and a third area (386). The second area (384) has the greatest area of contact between the first and second components (356) and (358), respectively. The first and third areas (382) and (386), respectively, have smaller mating areas, and each include additional thermal interface material, as demonstrated by the filled regions.

At (380), the TIM object (370) is shown forming a thermal interface between the first and second components (356) and (358), respectively. As shown, there are no air gaps visible with the formation of the thermal interface. More specifically, the shape and profile of the TIM object (370) at the first and third areas (382) and (386), respectively, fill the voids formed by the air gaps of the prior art. In one embodiment, the TIM object (370) has an hourglass shape, with the first and third areas (382) and (386) having a wider profile than the second area (384). Accordingly, the configuration of the TIM object (370), together with its custom configuration from the topological scanning and employment thereof, mitigates formation of the air gaps, thereby reducing thermal resistance.

Figure 4:
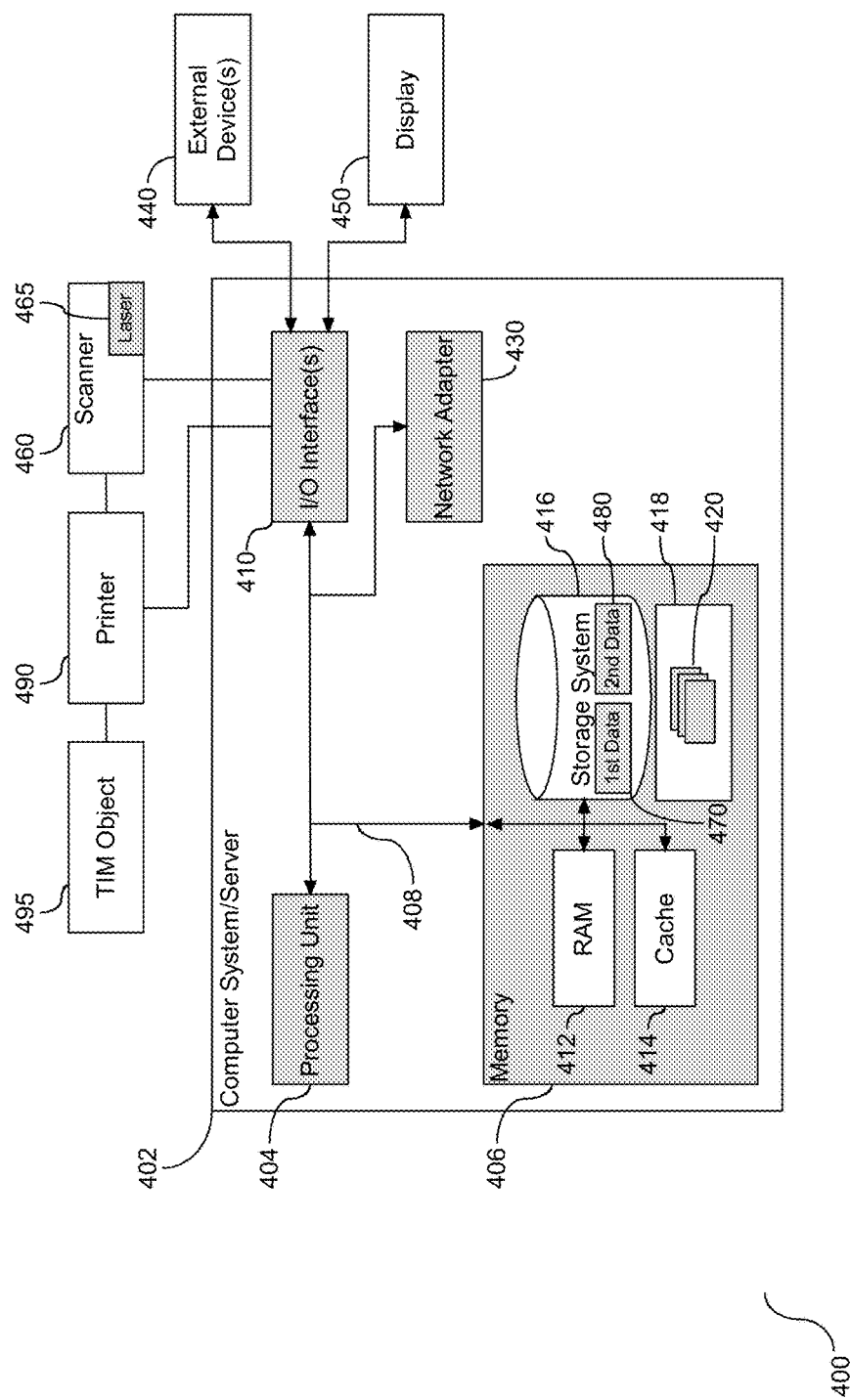
FIG. 4 is a block diagram illustrating a system to form a thermal interface between an electronic component and a heat sink, according to an embodiment.

The processes shown and described in FIGS. 1 and 2 may be implemented and controlled with a computer. With reference to FIG. 4, a block diagram (400) is provided illustrating an example of a computer system/server (402), hereinafter referred to as a host (402) to form a thermal interface object, as described above with respect to FIGS. 1 and 2, and to employ a thermal interface object to mate a semiconductor with a heat sink in a manner that reduces, if not eliminate thermal resistance. The host (402) is operational with numerous other general purpose or special purpose computing system environments or configurations. Examples of well-known computing systems, environments, and/or configurations that may be suitable for use with host (402) include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and filesystems (e.g., distributed storage environments and distributed cloud computing environments) that include any of the above systems or devices, and the like.

Host (402) may be described in the general context of computer system-executable instructions, such as program modules, being executed by a computer system. Generally, program modules may include routines, programs, objects, components, logic, data structures, and so on that perform particular tasks or implement particular abstract data types. Host (402) may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, host (402) is shown in the form of a general-purpose computing device. The components of host (402) may include, but are not limited to, one or more processors or processing units (404), a system memory (406), and a bus (408) that couples various system components including system memory (406) to processor (404). Bus (408) represents one or more of any of several types of bus structures, including a memory bus or memory controller, a peripheral bus, an accelerated graphics port, and a processor or local bus using any of a variety of bus architectures. By way of example, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Host (402) typically includes a variety of computer system readable media. Such media may be any available media that is accessible by host (402) and it includes both volatile and non-volatile media, removable and non-removable media.

Memory (406) can include computer system readable media in the form of volatile memory, such as random access memory (RAM) (412) and/or cache memory (414). Host (402) further includes other removable/non-removable, volatile/non-volatile computer system storage media. By way of example only, storage system (416) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (408) by one or more data media interfaces. As will be further depicted and described below, memory (406) may include at least one program product having a set (e.g., at least one) of program modules that are configured to carry out the functions of the embodiments described above with reference to FIGS. 1-3.

Program/utility (418), having a set (at least one) of program modules (420), may be stored in memory (406) by way of example, and not limitation, as well as an operating system, one or more application programs, other program modules, and program data. Each of the operating systems, one or more application programs, other program modules, and program data or some combination thereof, may include an implementation of a networking environment. Program modules (420) generally carry out the functions and/or methodologies of embodiments as described herein. For example, the set of program modules (420) may include at least one module that is configured to communicate with one or more tools to perform the process described above with reference to FIGS. 1 and 2.

Host (402) can communicate with one or more networks such as a local area network (LAN), a general wide area network (WAN), and/or a public network (e.g., the Internet) via network adapter (430). As depicted, network adapter (430) communicates with the other components of host (402) via bus (408). In one embodiment, a filesystem, such as a distributed storage system, may be in communication with the host (402) via the I/O interface (410) or via the network adapter (430). It should be understood that although not shown, other hardware and/or software components could be used in conjunction with host (402). Examples, include, but are not limited to: microcode, device drivers, redundant processing units, external disk drive arrays, RAID systems, tape drives, and data archival storage systems, etc.

Host (402) may also communicate with one or more external devices (440), such as a keyboard, a pointing device, etc.; a display (450); one or more devices that enable a user to interact with host (402); and/or any devices (e.g., network card, modem, etc.) that enable host (402) to communicate with one or more other computing devices. Such communication can occur via Input/Output (I/O) interface(s) (410).

In one embodiment, the host (402) is in further communication with one or more tools to design and create a thermal interface object. As shown, the one or more tools may include a scanning device (460) to electronically scan at least a first exposed surface of at least a first electronic component. In one embodiment, the scanning device comprises a laser (465) to scan the topology of an exposed surface of the first component. The electronic scanning performed by the scanning device (460) is used to derive measurement data associated with the exposed surface of the first component. First topological data (470) is derived from the electronic scan and is stored in a first memory location, such as a first location in memory. The first topological data (470) may be derived by the scanning device (460) itself, or by another external device (not shown). Accordingly, the first topological data (470) is measurement data of the surface topology of the first component.

The scanning device (460) may also be further employed to electronically scan an exposed surface of a second electronic component in a similar manner to the scan of the first component. Second topological data (480) is derived from the electronic scan of the second component and is stored in a second memory location, such as a second location in memory (406).

The surface topology data (470) and (480) are inverted, and the inverted aspects of the topology data (470) and (480) are programmed into a machine (490) to create a thermal interface object (495). In one embodiment, the machine (490) is a three-dimensional (3D) printer to print the thermal interface object. The programming may control a composition of the thermal interface object material based on relative surface position along the exposed surface of the electronic component. For example, the composition may be controlled to provide a more thermally conductive material along an area requiring greater heat removal, as compared to other areas along the exposed surface of the electronic component.

As will be appreciated by one skilled in the art, the aspects may be embodied as a system, method, or computer program product. Accordingly, the aspects may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, the aspects described herein may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for the embodiments described herein may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The embodiments are described above with reference to flow chart illustrations and/or block diagrams of methods, apparatus (systems), and computer program products. It will be understood that each block of the flow chart illustrations and/or block diagrams, and combinations of blocks in the flow chart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow chart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flow chart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions, which execute on the computer or other programmable apparatus, provide processes for implementing the functions/acts specified in the flow chart and/or block diagram block or blocks.

The flow charts and block diagrams in the Figures illustrate the architecture, functionality, and operation of possible implementations of systems, methods, and computer program products according to various embodiments. In this regard, each block in the flow charts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flow chart illustration(s), and combinations of blocks in the block diagrams and/or flow chart illustration(s), can be implemented by special purpose hardware-based systems that perform the specified functions or acts, or combinations of special purpose hardware and computer instructions.

The embodiments described herein may be implemented in a system, a method, and/or a computer program product. The computer program product may include a computer readable storage medium (or media) having computer readable program instructions thereon for causing a processor to carry out the embodiments described herein.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmissions, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

The embodiments are described herein with reference to flow chart illustrations and/or block diagrams of methods, apparatus (systems), and computer program products. It will be understood that each block of the flow chart illustrations and/or block diagrams, and combinations of blocks in the flow chart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow chart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flow chart and/or block diagram block or blocks.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

It will be appreciated that, although specific embodiments have been described herein for purposes of illustration, various modifications may be made without departing from the spirit and scope of the embodiments. Accordingly, the scope of protection of the embodiments is limited only by the following claims and their equivalents.

What is claimed is:

1. A method comprising:
deriving first surface topography data associated with at least a first exposed surface of a first body; and
creating a thermal interface object having thermal interface properties based on the first surface topography data, including translating the first surface topography data to a first surface of the thermal interface object.

2. The method of claim 1, further comprising:
electronically scanning the at least first exposed surface, wherein deriving the first surface topography data is based on the electronic scanning.

3. The method of claim 1, wherein translating the first topography data further comprises inverting the first surface topography data, and wherein the object is created from the inverted first surface topography data.

4. The method of claim 1, wherein creating the thermal interface object further comprises printing a three dimensional object with a three dimensional printer, and wherein the object comprises a thermal interface material.

5. The method of claim 1, further comprising placing the first body in thermal communication with a second body, including placing a first surface of the thermal interface object into contact with the first exposed surface of the first body and placing a second surface of the thermal interface object into contact with the second body, wherein the thermal interface object forms a thermal interface between the first and second bodies.

6. The method of claim 5, wherein the first body is a heat dissipating component, and the second body is a heat generating component.

7. The method of claim 5, wherein the thermal interface object forms a substantial thermal seal for mitigating thermal resistance between the first and second bodies.

8. The method of claim 6, further comprising:
electronically scanning a second exposed surface of the second body; and
deriving second measurement data associated with the second exposed surface based on the electronic scanning, wherein the second measurement data comprises second topography data, and wherein creating the thermal interface object comprises translating the second topography data to customize a second surface of the thermal interface object.

9. A system comprising:
a processor in communication with memory;
the processor to derive first surface topography data associated with at least a first exposed surface of a first body;
a machine in communication with the processor, the machine to create an object having thermal interface properties based on the first surface topography data, including translating the first surface topography data to a first surface of the thermal interface object.

10. The system of claim 9, further comprising:
a scanner in communication with the processor, the scanner to electronically scan the at least first exposed surface, wherein derivation of the first surface topography data is based on the electronic scanning.

11. The system of claim 9, wherein the machine is a three dimensional printer, and wherein creating the thermal interface object comprises the three dimensional printer to print the thermal interface object comprised of a thermal interface material.

12. The system of claim 9, further comprising the processor to invert the surface topography data, wherein the object is created from the inverted surface topography data.

13. The system of claim 9, further comprising a tool to place the first body in communication with a second body, including the tool to place a first surface of the thermal interface object into contact with the first body and to place a second surface of the thermal interface object into contact with the second body, wherein the thermal interface object forms a thermal interface between the first and second bodies.

14. The system of claim 13, wherein the first body is a heat generating component, and the second body is a heat dissipating component.

15. The system of claim 13, wherein the thermal interface object forms a substantial thermal seal for mitigating thermal resistance between the first and second bodies.

16. The system of claim 15, further comprising a scanner in communication with the processor, the scanner to electronically scan the second exposed surface of the second body.

17. The system of claim 13, wherein the tool comprises a laser to electronically scan the at least first exposed surface.

18. A computer program product comprising a non-transitory computer-readable storage device having computer program code embodied therewith, the program code executable by a processor to:
derive first surface topography data associated with the at least first exposed surface; and
create a thermal interface object having thermal interface properties based on the first surface topography data, including program code to translate the first surface topography data to a first surface of the thermal interface object.

19. The computer program product of claim 18, further comprising program code to:
electronically scan the at least first exposed surface, wherein derivation of the first surface topography data is based on the electronic scanning.

20. The computer program product of claim 18, further comprising program code to place the first body in communication with a second body, including program code to place a first surface of the thermal interface object into contact with the first body and to place a second surface of the thermal interface object into contact with the second body, wherein the thermal interface object forms a thermal interface between the first and second bodies, and wherein the thermal interface object forms a substantial thermal seal for mitigating thermal resistance between the first and second bodies.

* * * * *